(12) United States Patent
Chen et al.

(10) Patent No.: US 10,679,961 B2
(45) Date of Patent: Jun. 9, 2020

(54) CIRCUIT PIN POSITIONING STRUCTURE, FABRICATION METHOD OF SOLDERED CIRCUIT ELEMENTS, AND METHOD OF FORMING CIRCUIT PINS OF A STACKED PACKAGE

(71) Applicant: Tarng Yu Enterprise co., ltd., New Taipei (TW)

(72) Inventors: Tsung-Chi Chen, New Taipei (TW); Mu-Jung Huang, New Taipei (TW)

(73) Assignee: TARNG YU ENTERPRISE CO., LTD., New Taipei (TW)

( * ) Notice: Subject to any disclaimer, the term of this patent is extended or adjusted under 35 U.S.C. 154(b) by 461 days.

(21) Appl. No.: 15/487,255

(22) Filed: Apr. 13, 2017

(65) Prior Publication Data

US 2018/0082974 A1    Mar. 22, 2018

(30) Foreign Application Priority Data

Sep. 22, 2016   (TW) .............................. 105130607 A

(51) Int. Cl.
| | |
|---|---|
| *B23K 1/00* | (2006.01) |
| *H01L 23/00* | (2006.01) |
| *B23K 3/08* | (2006.01) |
| *B23K 1/008* | (2006.01) |
| *B23K 101/42* | (2006.01) |

(52) U.S. Cl.
CPC .............. *H01L 24/75* (2013.01); *B23K 1/008* (2013.01); *B23K 1/0016* (2013.01); *B23K 3/087* (2013.01); *H01L 24/81* (2013.01); *B23K 2101/42* (2018.08); *H01L 2224/75272* (2013.01); *H01L 2224/75651* (2013.01); *H01L 2224/75756* (2013.01); *H01L 2224/8121* (2013.01); *H01L 2224/81169* (2013.01); *H01L 2924/3511* (2013.01)

(58) Field of Classification Search
CPC ........................... B23K 2101/42; B23K 3/087
USPC ................................................ 228/212, 49.1
See application file for complete search history.

(56) References Cited

U.S. PATENT DOCUMENTS

| | | | |
|---|---|---|---|
| 8,851,358 B2* | 10/2014 | Saito ...................... | B23K 31/02 |
| | | | 174/258 |
| 2003/0042626 A1* | 3/2003 | Howarth ............. | H01L 23/3128 |
| | | | 257/797 |
| 2016/0358898 A1* | 12/2016 | Zhou ................... | H01L 25/0657 |

* cited by examiner

*Primary Examiner* — Erin B Saad
(74) *Attorney, Agent, or Firm* — Chun-Ming Shih; LanWay IPR Services

(57) ABSTRACT

The invention provides a circuit pin positioning structure, a fabrication method of soldered circuit elements and a method of forming circuit pins of a stacked package, applicable to a semiconductor package structure. A positioning rack and a plurality of conductor elements are used. A plurality of positioning holes are provided on a bottom surface of the positioning rack to form a conductor positioning area, and an operational portion is formed on an opposing surface away from the conductor positioning area, for being mounted with pick and place equipment. The conductor elements are positioned in the positioning holes. When the pick and place equipment loads and moves the positioning rack to preformed circuit contacts of the stacked package, the conductor elements are soldered to the preformed circuit contacts and then the positioning rack is removed.

7 Claims, 20 Drawing Sheets

CIRCUIT PIN POSITIONING STRUCTURE, FABRICATION METHOD OF SOLDERED CIRCUIT ELEMENTS, AND METHOD OF FORMING CIRCUIT PINS OF A STACKED PACKAGE

CROSS-REFERENCE TO RELATED APPLICATIONS

This application claims the priority of Republic of China Patent Application No. 105130607 filed on Sep. 22, 2016, in the State Intellectual Property Office of the R.O.C., the disclosure of which is incorporated herein by reference.

BACKGROUND OF THE INVENTION

Field of the Invention

The invention relates to semiconductor packaging technologies, and more particularly, to a circuit pin positioning structure, a fabrication method of soldered circuit elements and a method of forming circuit pins of a stacked package.

Descriptions of the Related Art

Semiconductor industry has developed rapidly since integrated circuits (IC) being invented and due to integration density of various electronic components (such as transistor, diode, resistor, capacitor and so on) keeping rising. Mostly, decrease in minimum feature size leads to the rise in integration density and makes more components integrated within a predetermined area.

Smaller electronic components correspond to smaller semiconductor packages (which have even smaller areas than other conventional packages). These smaller semiconductor packages include: quad flat packages (QFP), ball grid array (BGA) package, flip chip (FC) package, three dimensional integrated circuit (3DIC), wafer level package (WLP) and package on package (PoP).

Conventional packaging technologies use a bonding material having metal particles (such as conductive adhesive, solder paste, non-conductive adhesive and so on) to bond two different bonding pads of stacked packages, panels and/or IC circuit boards. In a stacked package structure, a plurality of semiconductor chips can be individually packaged to form a plurality of packages, or a plurality of semiconductor chips can all be packaged to form a single package, and then a plurality of such packages are stacked to form the stacked package structure, such that the semiconductor chips in different packages can be functionally combined to perform predetermined tasks. These individual packages being stacked can be electrically connected to each other by using, for example, contact bumps or other connection elements. However these packages when being stacked and connected to each other encounter the following problems, which should be solved. When placing bonding pads or conductor elements on the stacked packages, it is performed one by one on predetermined positions on the corresponding packages. This makes the fabrication process time-ineffective and inefficient. By such conventional assembly and placement methods for bonding pads, if re-assembly or re-placement is required, the whole package structure must be discarded and thus causes waste on material and undesirable cost increase. And the stacked packages when being heated are prone to warpage and deformation.

Therefore, how to solve the above problems and drawbacks is an important topic in the art to endeavor.

SUMMARY OF THE INVENTION

In view of the above problems and drawbacks of conventional circuit pins, an invention has been accomplished with much efforts and endeavors to provide a circuit pin positioning structure, a fabrication method of soldered circuit elements and a method of forming circuit pins of a stacked package.

A primary object of the invention is to provide a circuit pin positioning structure, which allows a plurality of conductor elements to be in advance received in corresponding positioning holes of a positioning rack, and thus allows all the conductor elements to be one-time placed on preformed circuit contacts of a stacked package precisely, instead of using pick and place equipment to place conductor elements one by one on preformed circuit contacts of stacked packages, thereby improving fabrication efficiency and overall yield.

Another object of the invention is to provide a circuit pin positioning structure, wherein a plurality of conductor elements and corresponding preformed circuit contacts are all individually provided, such that when any of the conductor elements is not well soldered to a corresponding preformed circuit contact, it (the defective conductor element) can be re-processed itself. There is no need to discard an entire package structure and thus fabrication costs are reduced.

A further object of the invention is to provide a fabrication method of soldered circuit elements and a method of forming circuit pins of a stacked package, which use heating equipment to heat and eliminate internal stress in a positioning rack generated by inserting conductor elements therein, such that pick and place equipment may smoothly separate the conductor elements from the positioning rack.

For the objects said above and for other objects, the invention provides a circuit pin positioning structure applicable for forming circuit pins of a stacked package having a plurality of preformed circuit contacts, the circuit pin positioning structure capable of being picked and placed by pick and place equipment, the circuit pin positioning structure including a positioning rack and a plurality of conductor elements, wherein: the positioning rack has a top surface and a bottom surface, wherein the bottom surface is provided with a plurality of positioning holes to form a conductor positioning area, allowing the plurality of conductor elements to be respectively positioned in the plurality of positioning holes, and the top surface is provided with an operational portion, allowing the pick and place equipment to pick and place the operational portion to move the positioning rack to the stacked package, so as to solder the plurality of conductor elements respectively to the plurality of preformed circuit contacts to form the circuit pins of the stacked package; when the circuit pins of the stacked package are completely formed, the positioning rack is removed from the stacked package by the pick and place equipment.

The invention further provides a circuit pin positioning structure applicable to a semiconductor package structure having a plurality of preformed circuit contacts and for allowing pick and place equipment to mount thereon, the circuit pin positioning structure including a positioning rack and a plurality of conductor elements, wherein: the positioning rack is provided with a plurality of positioning holes on a surface thereof to form a conductor positioning area, allowing the plurality of conductor elements to be respectively positioned in the plurality of positioning holes, and the positioning rack is formed with an operational portion on another surface thereof away from and opposing to the surface having the conductor positioning area; when the pick and place equipment is mounted with the operational portion, the positioning rack is moved by the pick and place equipment to the plurality of preformed circuit contacts of the semiconductor package structure so as to solder the plurality of conductor elements respectively to the plurality of preformed circuit contacts; the positioning rack is removed when the plurality of conductor elements are completely soldered to the plurality of preformed circuit contacts.

Preferably, the plurality of positioning holes are formed in a peripheral area of the bottom surface of the positioning rack.

Preferably, the plurality of positioning holes of the positioning rack include at least two rows of positioning holes.

Preferably, the plurality of positioning holes of the positioning rack are rectangular holes, circular holes or polygonal holes.

Preferably, the bottom surface of the positioning rack is formed with an inwardly indented receiving space for receiving an electronic component on the stacked package.

Preferably, the operational portion includes at least one operational slot extended from the top surface to the bottom surface of the positioning rack.

Preferably, the operational portion includes at least one operational protrusion extended outwardly from the top surface of the positioning rack.

Preferably, the plurality of conductor elements are respectively formed by cutting a single line material, and are cylinders, circular tubes, polygonal pillars or polygonal tubes.

Preferably, the plurality of conductor elements are respectively embedded and positioned in the plurality of positioning holes, and the positioning rack has a thickness larger than a length of the conductor elements.

Preferably, the top surface of the positioning rack is formed with a gripping area for being gripped by the pick and place equipment.

The invention further provides a method of forming circuit pins of a stacked package, including the steps of: (A1) providing at least one stacked package having a plurality of preformed circuit contacts; (B1) providing a circuit pin positioning structure including a positioning rack and a plurality of conductor elements, wherein the plurality of conductor elements are formed by cutting a single line material and respectively positioned in the positioning rack; (C1) providing pick and place equipment for picking and placing the positioning rack; (D1) using the pick and place equipment to pick and place the positioning rack carrying the plurality of conductor elements, and soldering the plurality of conductor elements respectively to the plurality of preformed circuit contacts of the stacked package so as to form circuit pins of the stacked package; and (E1) allowing the pick and place equipment to remove the positioning rack from the stacked package.

Preferably, the plurality of conductor elements are respectively embedded and positioned in a plurality of positioning holes formed in the positioning rack.

Preferably, the positioning rack is made of a plastic material.

The invention further provides a fabrication method of soldered circuit elements, applicable to a semiconductor package structure, the fabrication method including the steps of: (A2) providing at least one stacked package having a plurality of preformed circuit contacts; (B2) providing pick and place equipment and a circuit pin positioning structure for being mounted with the pick and place equipment, the circuit pin positioning structure including a positioning rack and a plurality of conductor elements, wherein the positioning rack is formed with a plurality of positioning holes, and the plurality of conductor elements are respectively positioned in the plurality of positioning holes of the positioning rack; (C2) using the pick and place equipment to place the circuit pin positioning structure on the stacked package in a manner that the plurality of conductor elements of the circuit pin positioning structure are respectively in contact with the plurality of preformed circuit contacts of the stacked package; (D2) providing heating equipment and placing the stacked package and the circuit pin positioning structure in the heating equipment, and having the heating equipment heat to a solder-material melting temperature so as to solder the circuit pin positioning structure to the stacked package; (E2) removing the soldered circuit pin positioning structure and stacked package from the heating equipment; and (F2) using the pick and place equipment to remove the positioning rack of the circuit pin positioning structure from the stacked package.

Preferably, the fabrication method of soldered circuit elements further including: repeating the above steps (A2) to (F2) until a package structure having a plurality of stacked packages is formed.

Preferably, the plurality of conductor elements respectively interfere with the positioning rack to be positioned in the plurality of positioning holes.

Preferably, the positioning rack is heated by the heating equipment to release internal stress generated by interference between the positioning rack and the plurality of conductor elements.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
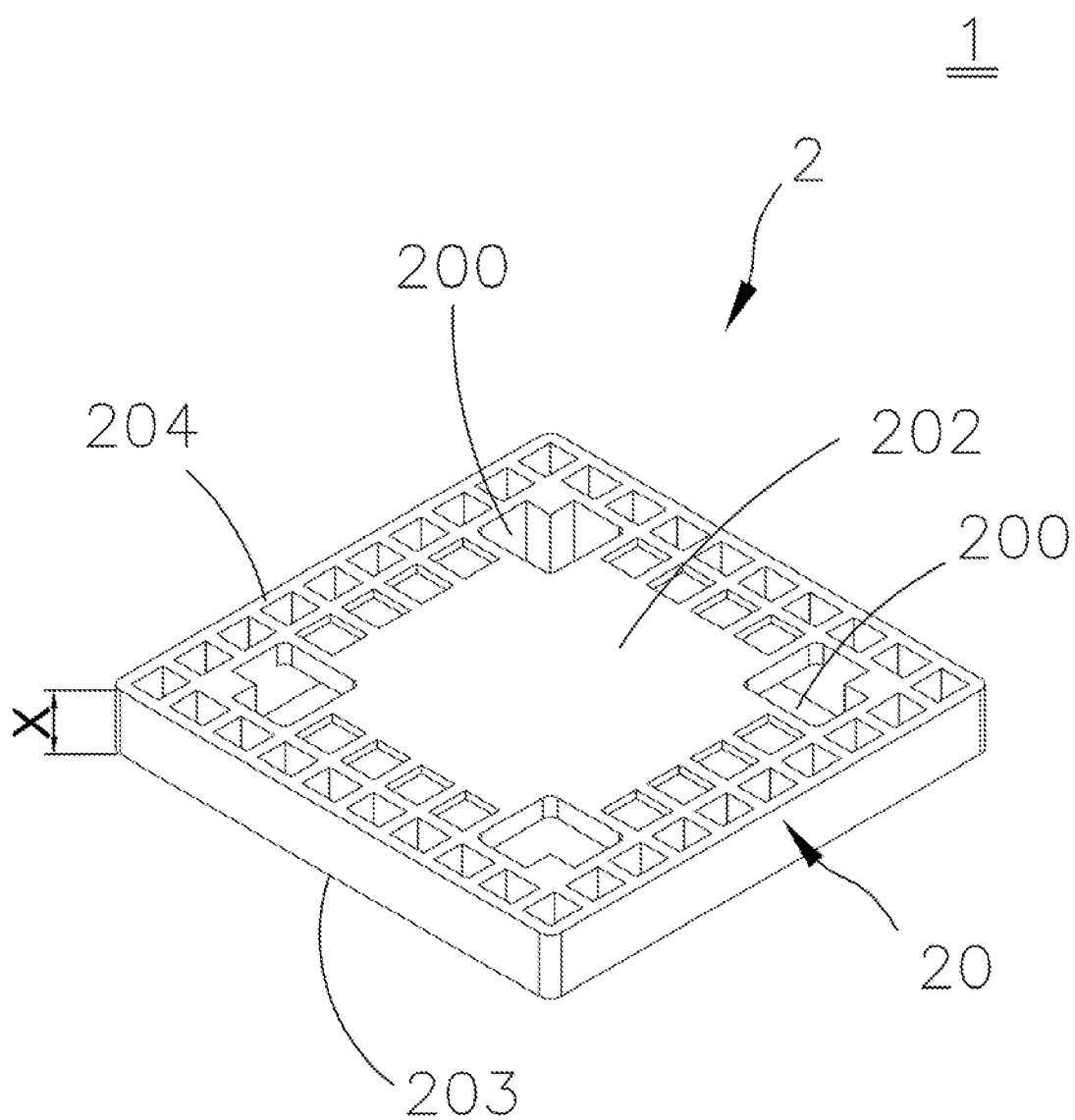
FIG. 1 is a perspective view of a first embodiment of the invention.
Figure 2:
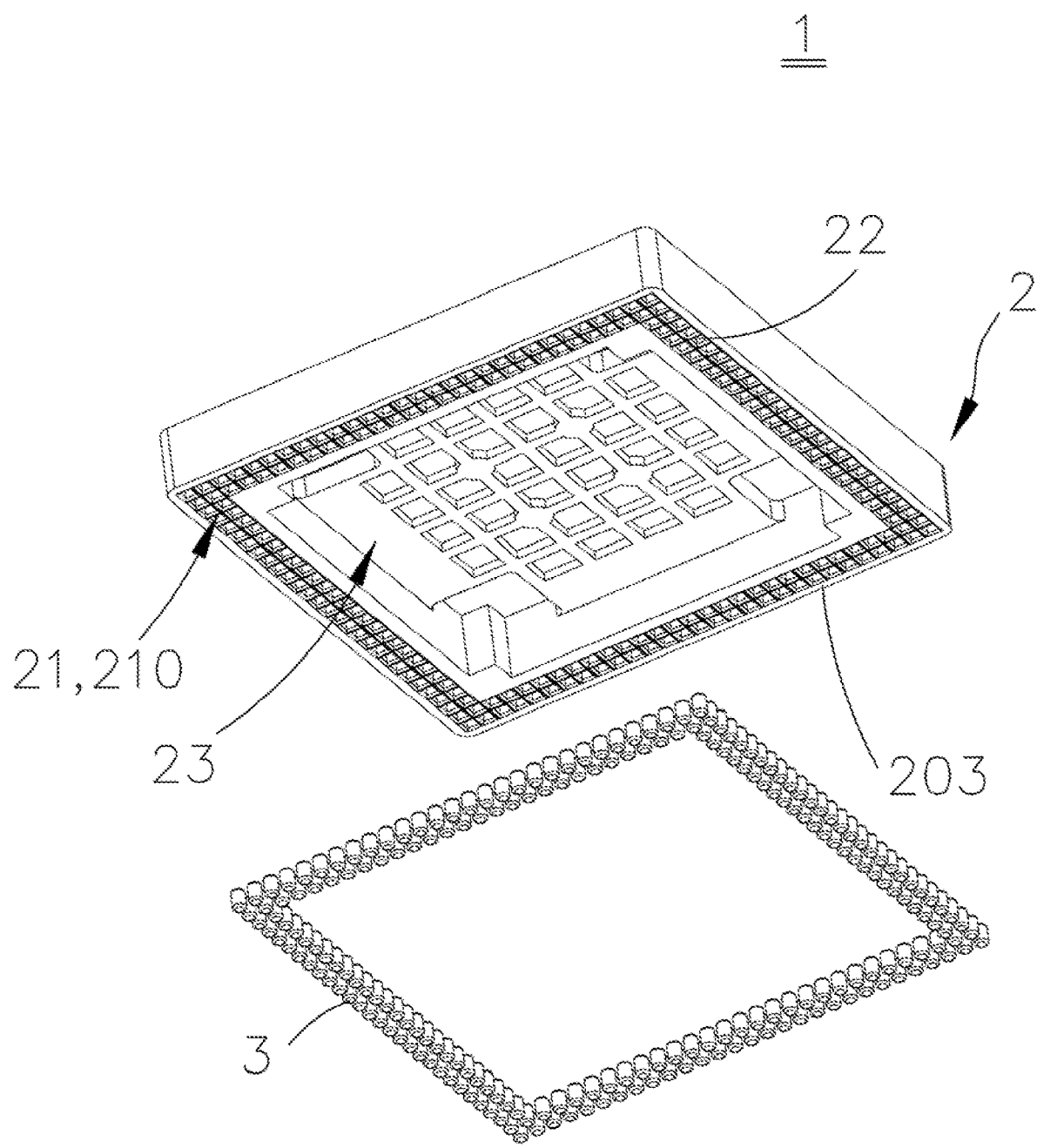
FIG. 2 is a perspective view from another angle of the first embodiment of the invention.
Figure 4:
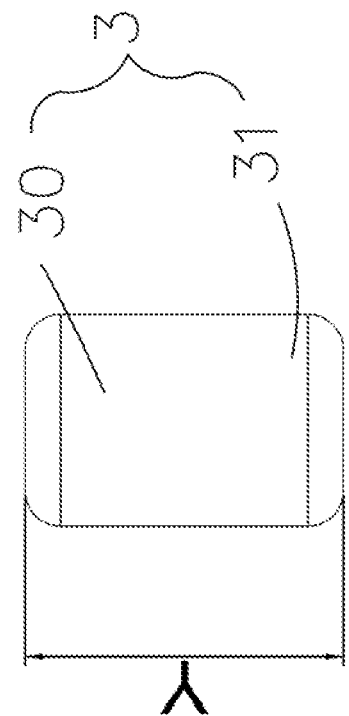
FIG. 4 is a front view of a conductor element of the first embodiment of the invention.
Figure 3:
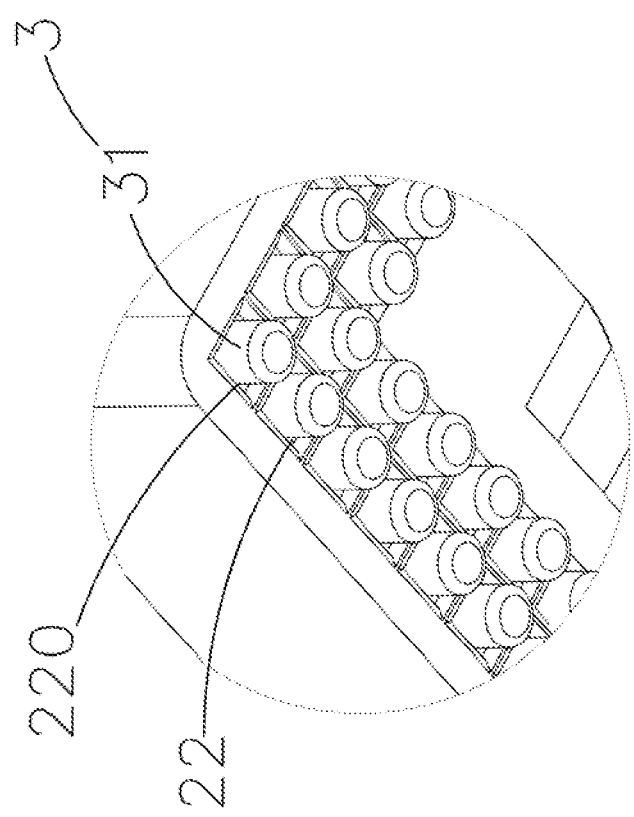
FIG. 3 is a partial perspective view of the first embodiment of the invention.
Figure 5:
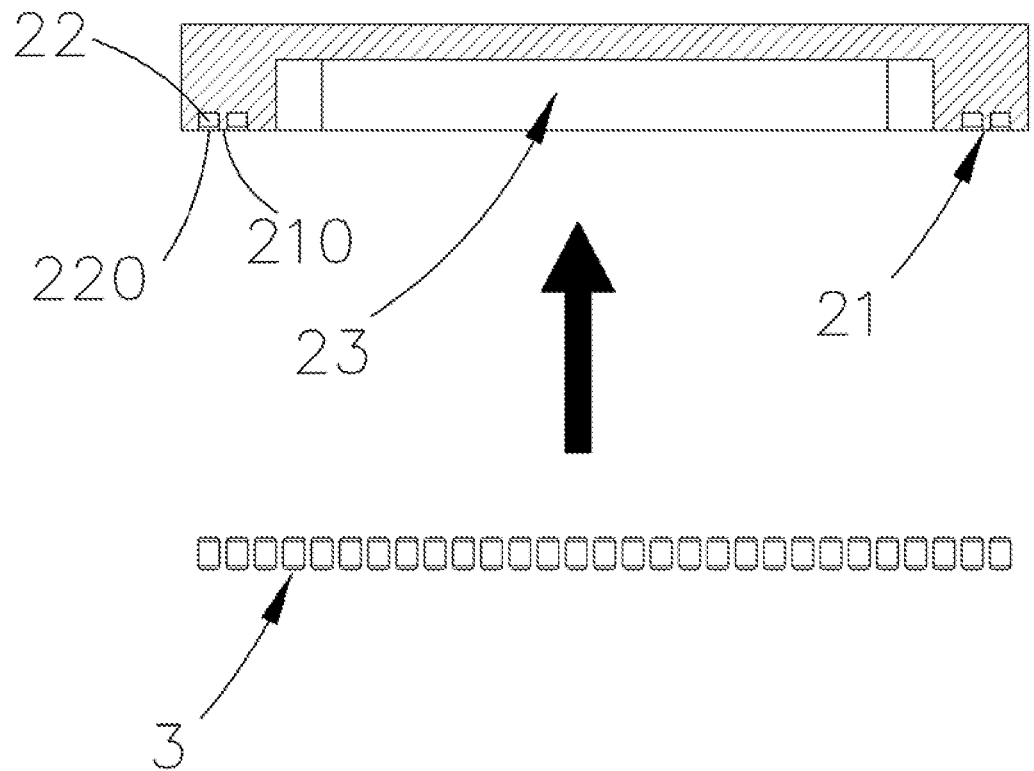
FIG. 5 is an assembly schematic diagram of the first embodiment of the invention.
Figure 6:
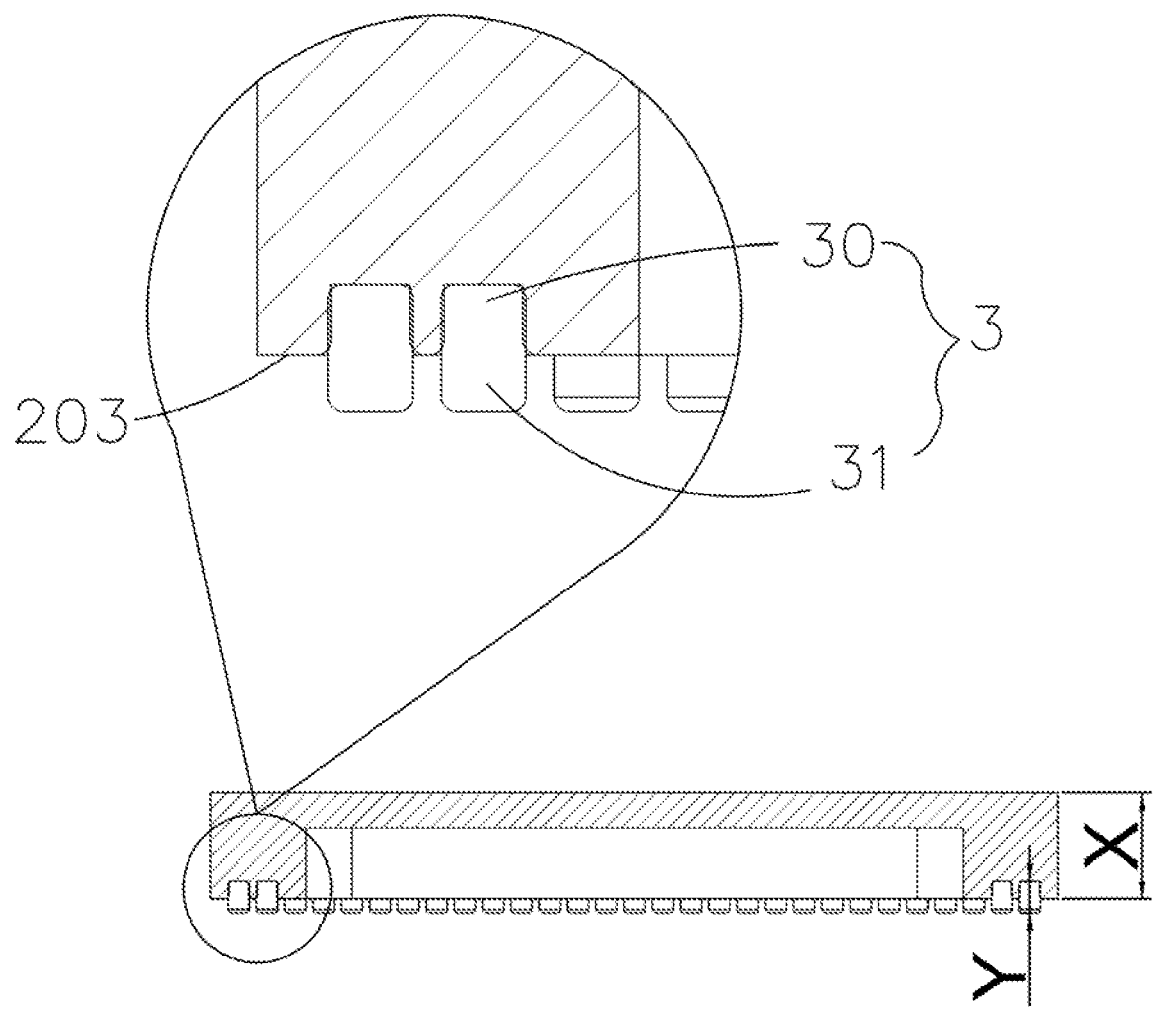
FIG. 6 is a sectional view of the first embodiment of the invention.
Figure 7:
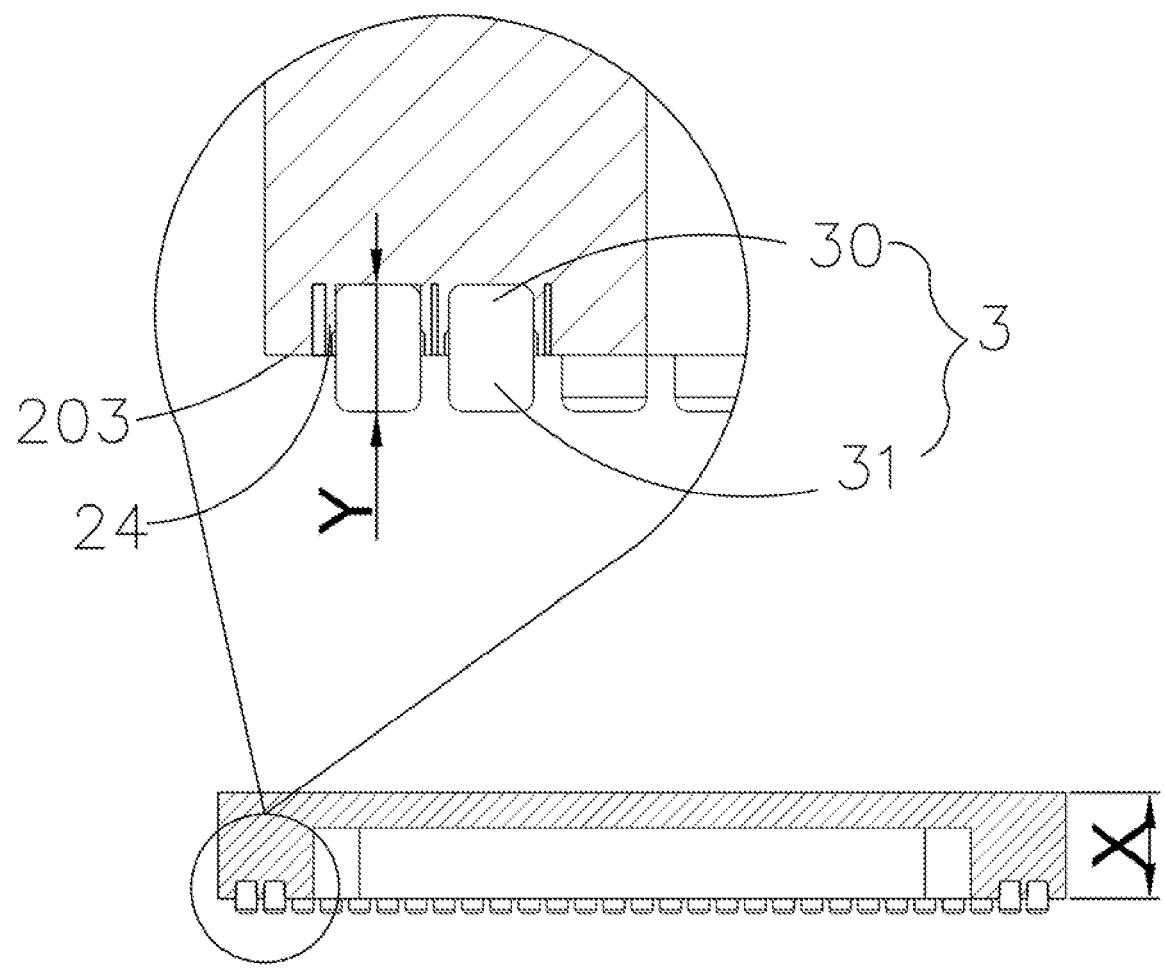
FIG. 7 is a sectional view of a second embodiment of the invention.

Embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

As shown in FIGS. 1 to 11, the invention provides a circuit pin positioning structure 1 for use on a semiconductor package structure to form circuit pins of a stacked package 4. The stacked package 4 includes a plurality of preformed circuit contacts 40. The circuit pin positioning structure 1 can be picked and placed by pick and place equipment 5, and includes a positioning rack 2 and a plurality of conductor elements 3.

Figure 8:
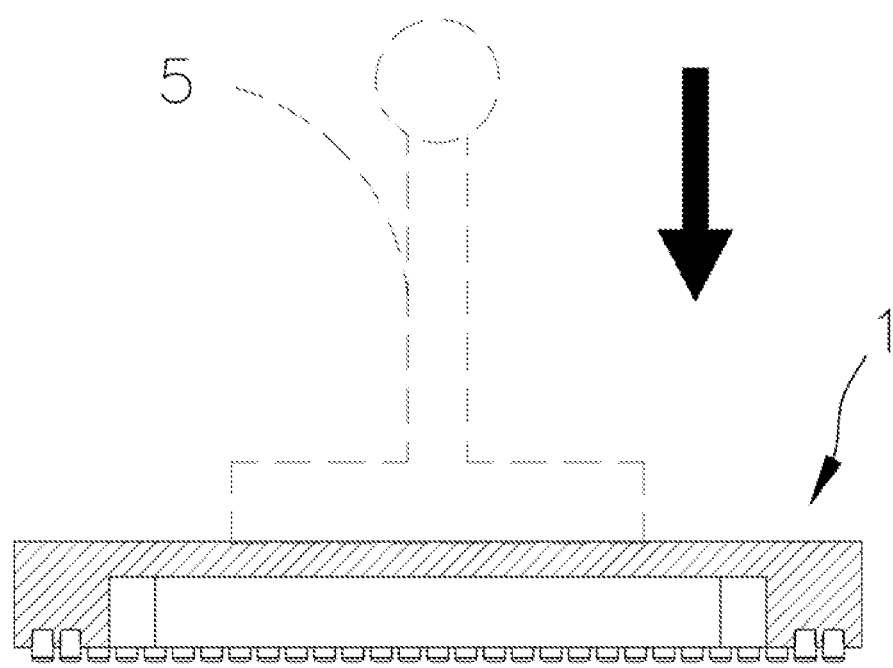
FIG. 8 is a first state of use diagram of the first embodiment of the invention.
Figure 9:
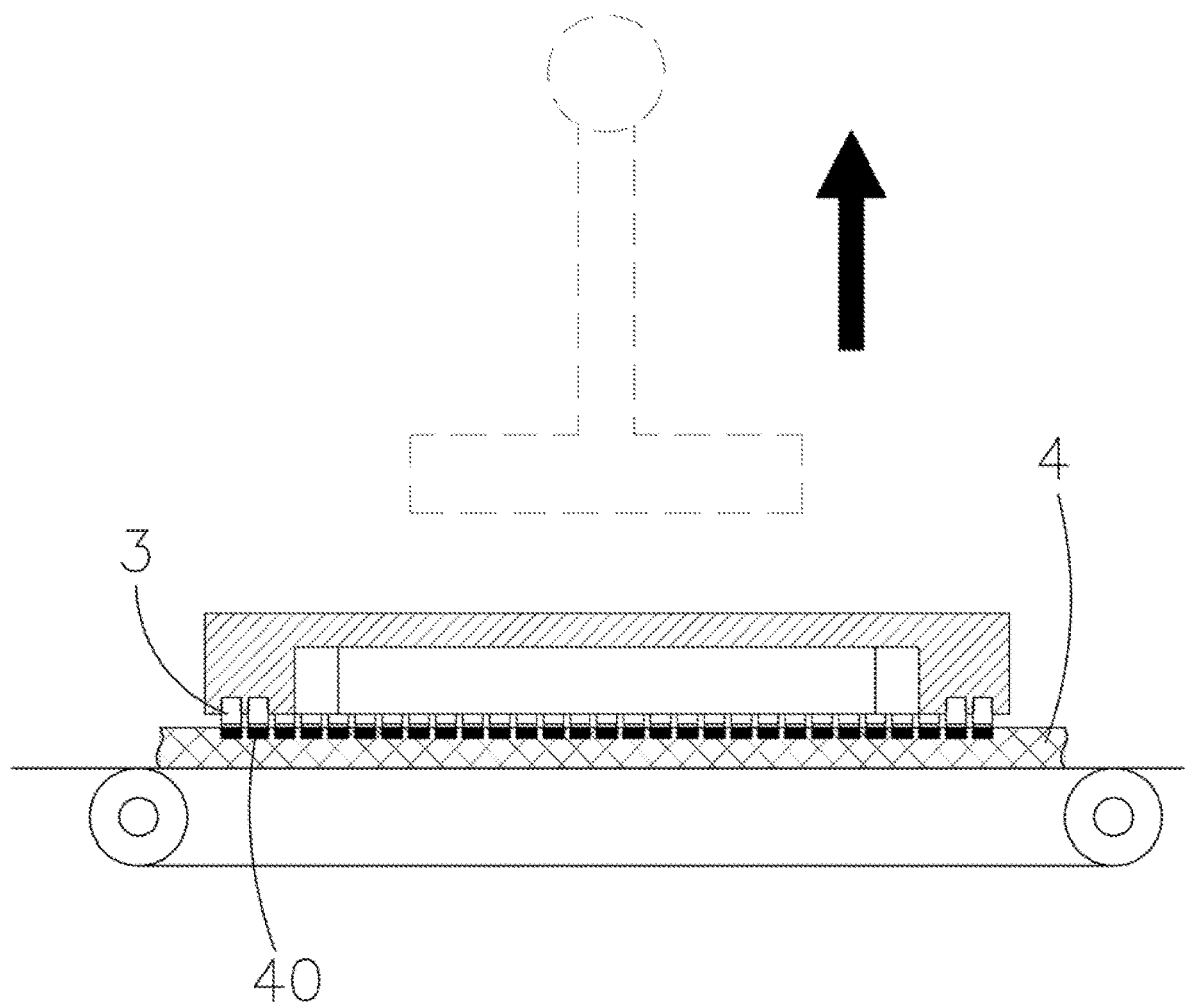
FIG. 9 is a second state of use diagram of the first embodiment of the invention.
Figure 10:
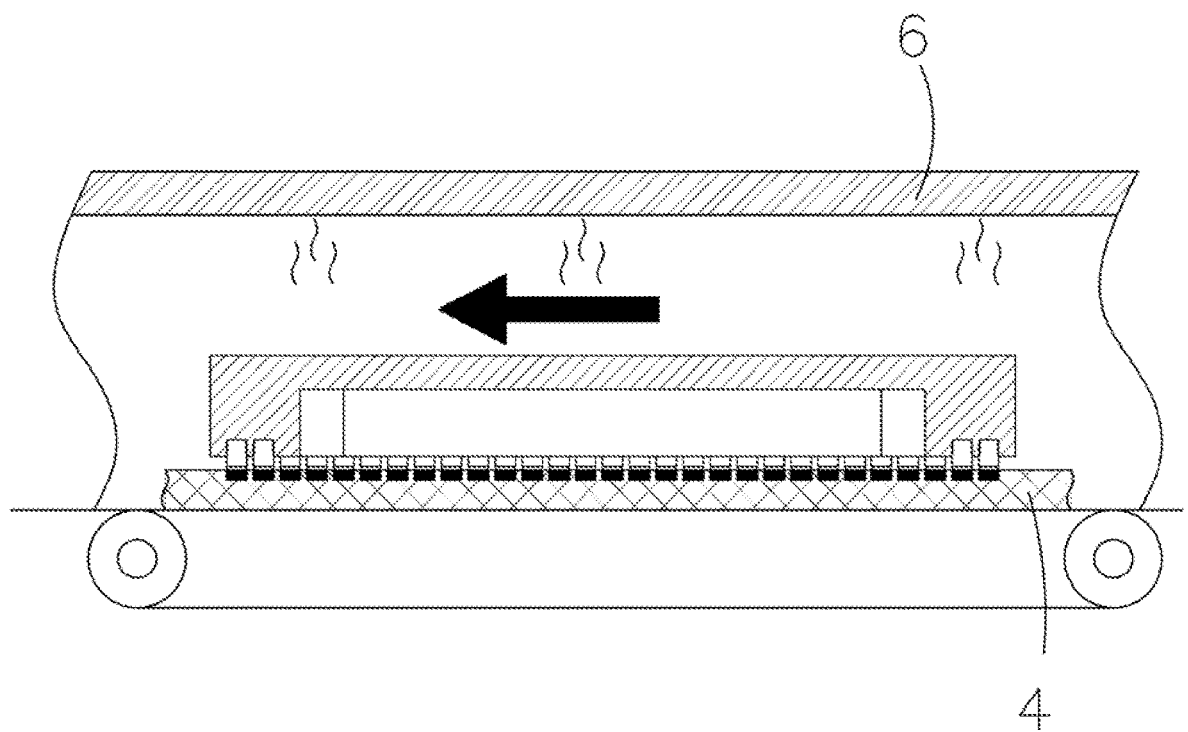
FIG. 10 is a third state of use diagram of the first embodiment of the invention.
Figure 11:
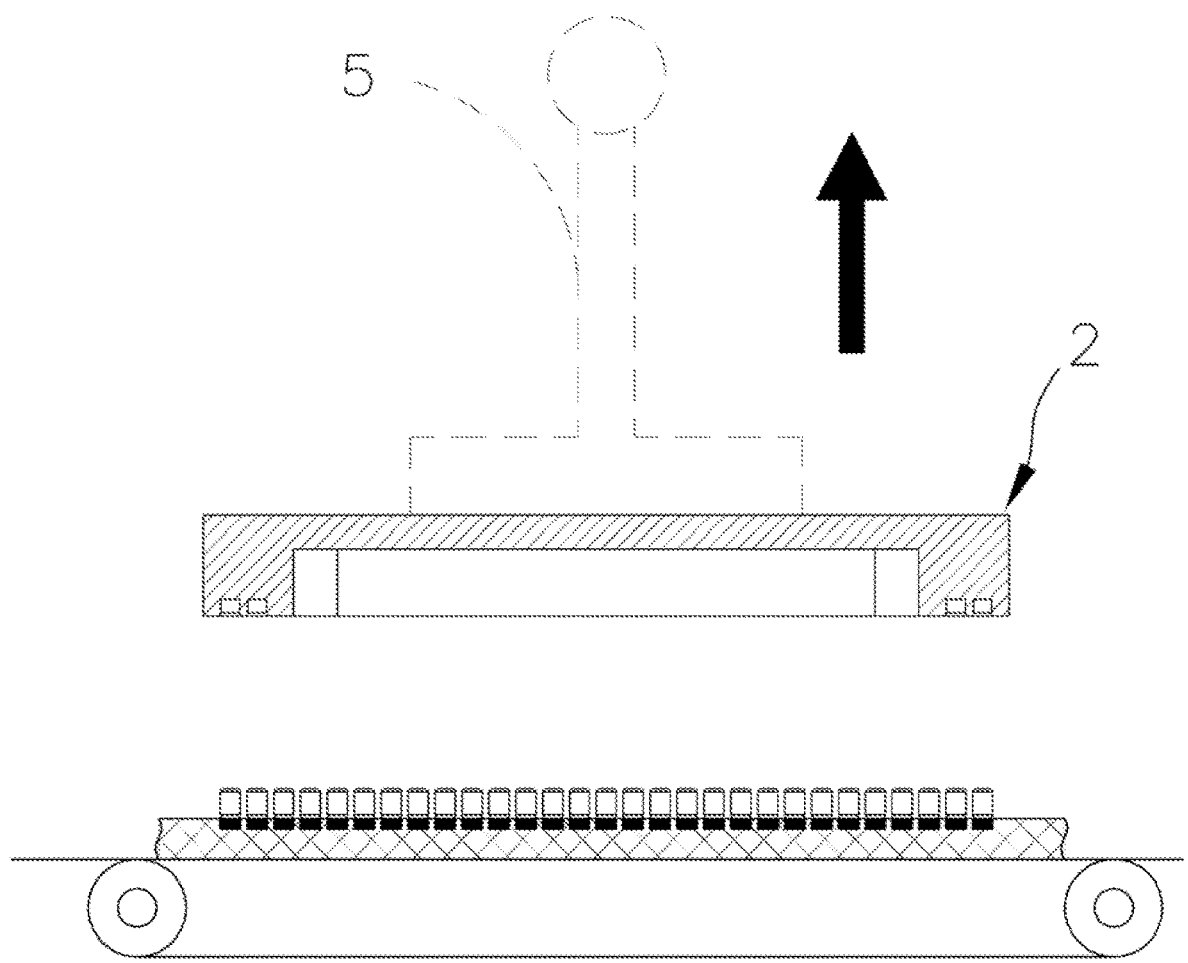
FIG. 11 is a fourth state of use diagram of the first embodiment of the invention.
Figure 12:
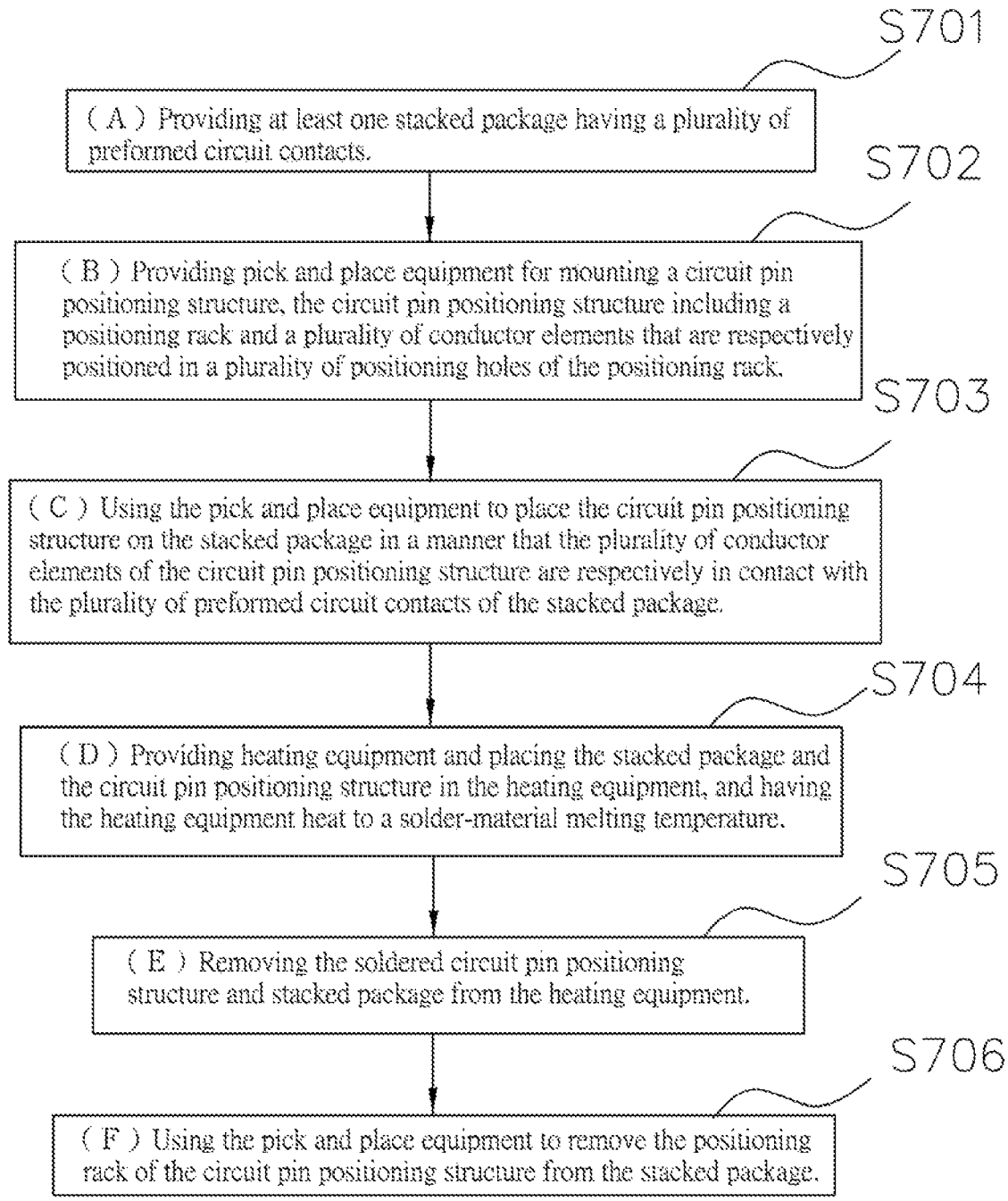
FIG. 12 is a first flowchart of a fabrication method of soldered elements of the invention.
Figure 13:
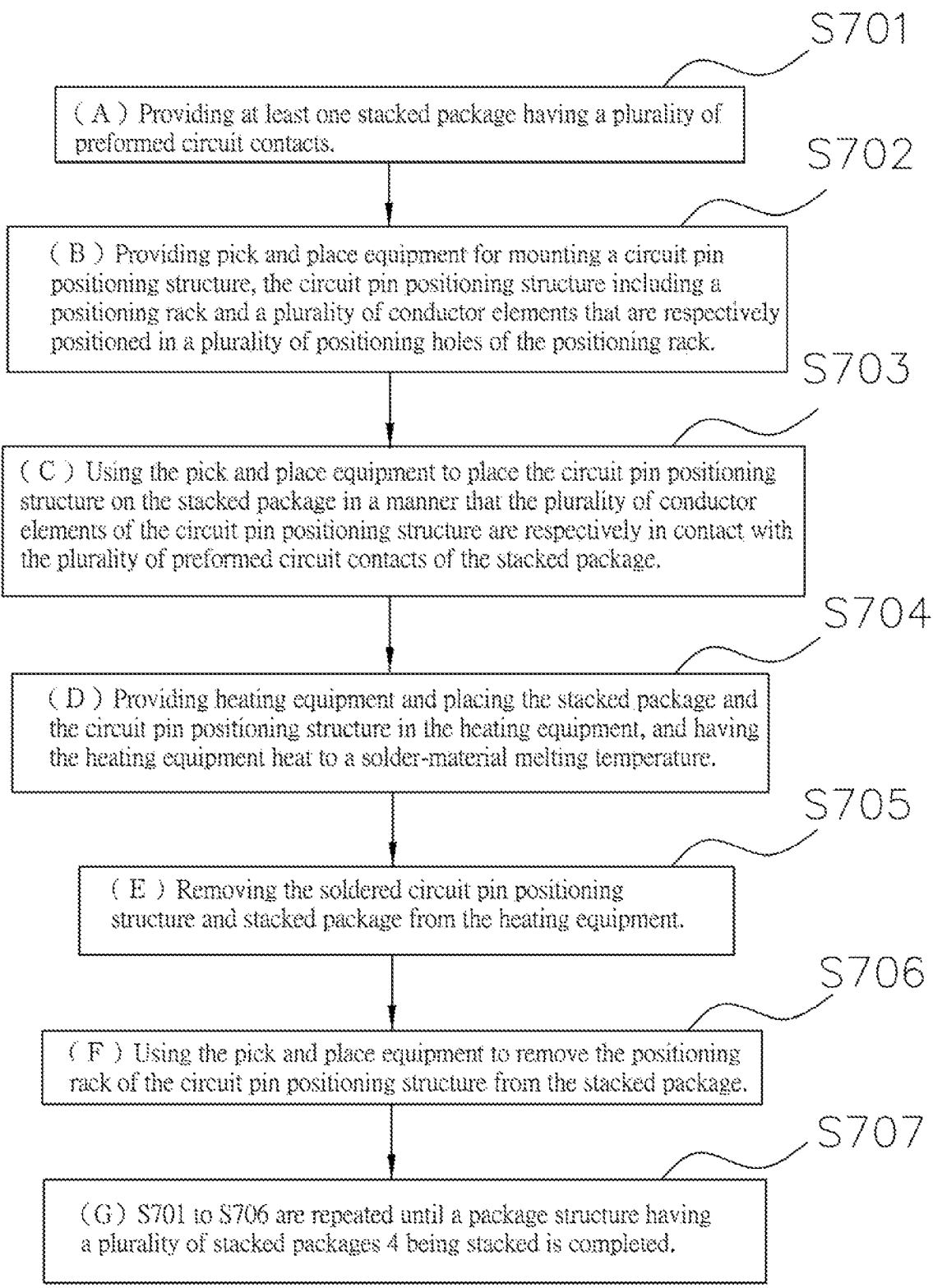
FIG. 13 is a second flowchart of the fabrication method of soldered elements of the invention.

The positioning rack 2 has a bottom surface 203 and a top surface 204 corresponding and opposing to the bottom surface 203, wherein the bottom surface 203 has a conductor positioning area 21. The conductor positioning area 21 is formed with a plurality of positioning holes 22 for respectively positioning the plurality of conductor elements 3. Each of the positioning holes 22 has an opening 220 at an end thereof for putting a corresponding one of the conductor elements 3 therein. The positioning rack 2 has an operational portion 20 formed on a side away from the conductor positioning area 21, allowing the pick and place equipment 5 to be mounted on the operational portion 20 (as shown in FIGS. 8 and 9). Particularly, the operational portion 20 is provided on the top surface 204 of the positioning rack 2, for being picked and placed by the pick and place equipment 5, so as to move the positioning rack 2 to the stacked package 4, and allow the plurality of conductor elements 3 to be soldered to the plurality of preformed circuit contacts 40 respectively and serve as circuit pins of the stacked package 4. In the embodiment shown in FIG. 2, the plurality of positioning holes 22 are provided in a peripheral area of the bottom surface 203 and in two rows, and are rectangular holes. It should be understood that, the positioning holes 22 are not limited to rectangular holes, but can be circular holes, polygonal holes, irregularly shaped holes or other shapes of holes. The bottom surface 203 of the positioning rack 2 is dented inwardly to form a receiving space 23 for receiving a chip (not shown), a resistor (not shown) or other electronic components. The operational portion 20 is formed with at least one operational slot 200 penetrated from the top surface 204 to the bottom surface 203. In the embodiment shown in FIG. 2, the operational portion 20 is formed with four L-shaped operational slots 200, and a gripping area 202 is provided at the center of the top surface 204 and for being picked and gripped by the pick and place equipment (not shown). In FIG. 1, a thickness of the positioning rack 2 between the top surface 204 and the bottom surface 203 is marked X.

The plurality of conductor elements 3 can be fabricated by cutting a single line material to form individual conductor elements. In the embodiment shown in FIG. 3, the conductor elements 3 can be cylinders, each of which includes an interfering portion 30 and a contact portion 31. The interfering portion 30 of each of the conductor elements 3 is embedded into a corresponding one of the positioning holes 22 and positioned in the corresponding positioning hole 22 in an interference manner. The interference manner can be achieved by close engagement between the corresponding conductor element 3 and positioning hole 22 or by using an elastic arm 24 shown in FIG. 7 to clamp the conductor element 3. The conductor element 3 is inserted into the positioning hole 22 through the opening 220 until the contact portion 31 is exposed from a contact region 210 of the conductor positioning area 21 of the positioning rack 2.

In the embodiment of FIGS. 1 to 6, the conductor element 3 has a length defined as Y. The thickness X of the positioning rack 2 is larger than or equal to the length Y of the conductor element 3, such that the positioning rack 2 has a sufficient thickness to sustain heat and minimize its deformation by heat and also prevent from being cracked by pressure from the conductor element 3. The conductor element 3 is inserted into the corresponding positioning hole 22 of the positioning rack 2 through the opening 220, with the contact portion 31 being exposed from the bottom surface 203 of the positioning rack 2. The conductor element 3 in the positioning hole 22 abuts against and presses on the positioning rack 2 in a manner of causing material deformation of the positioning rack 2, such that the positioning rack 2 generates interference internal stress on the conductor element 3 and makes the conductor element 3 firmly positioned in the positioning hole 22. It should be noted that, the larger the contact area between the conductor element 3 and an inner wall of the positioning hole 22, the more the interference between the conductor element 3 and the positioning rack 2. Accordingly, the positioning rack 2 would more easily generate interference internal stress on the conductor element 3, and assures the conductor element 3 not easy to be detached from the positioning hole 22.

The interference internal stress generated by the positioning rack 2 can be adjusted in magnitude by controlling interference between the conductor element 3 and the positioning rack 2. Interference at different contact parts between the conductor element 3 and the positioning rack 2 may be same or different. The controlling of interference between the conductor element 3 and the positioning rack 2 can be achieved by adjusting a substantial length or width of the inner wall of the positioning hole 22 or by adjusting a substantial length or width of the contact portion 31 of the conductor element 3.

In the embodiment of FIGS. 8 to 11, when the pick and place equipment 5 on a production line picks or grips the circuit pin positioning structure 1, it may place the circuit pin positioning structure 1 on the stacked package 4 of the production line. The stacked package 4 can be a circuit substrate, a stacked packaging component or any other component applicable for stacked packages. Heating equipment 6 is then used to melt a solder material provided on the contact portions 31 of the conductor elements 3 or on the stacked package 4 so as to solder the contact portions 31 to the stacked package 4. When the soldering process is finished, the circuit pin positioning structure 1 and the stacked package 4 are removed from the heating equipment 6. The melted solder material is allowed to cool down, and then the positioning rack 2 is removed by using the pick and place equipment 5. This thus completes a single time of fabrication of soldered circuit elements according to the invention.

As shown in FIGS. 1 to 13, a circuit pin positioning structure 1 of the invention is applied on a package structure to fabricate soldered circuit elements. This fabrication method includes the following steps.

In step S701, a production line provides a stacked package 4 preformed with a plurality of circuit contacts 40 thereon. The stacked package 4 can be delivered to the production line by a conveyor belt, or gripped and moved to the production line.

In step S702, pick and place equipment 5 and the circuit pin positioning structure 1 are provided. The pick and place equipment 5 mounts the circuit pin positioning structure 1 on the production line. The circuit pin positioning structure 1 includes a positioning rack 2 and a plurality of conductor elements 3. The conductor elements 3 are positioned in the positioning rack 2 in a manner that, the positioning rack 2 (for example, made of a plastic material) subject to pressure from the conductor elements 3 is deformed and generates interference internal stress. Particularly, the conductor elements 3 are squeezed into positioning holes 22 of the positioning rack 2 and press on inner walls of the positioning holes 22, such that the positioning rack 2 is deformed and generates the interference internal stress, making the conductor elements 3 firmly positioned in the positioning holes 22.

In step S703, the pick and place equipment 5 places the circuit pin positioning structure 1 on the stacked package 4 of the production line, allowing the plurality of conductor elements 3 of the circuit pin positioning structure 1 to be respectively in contact with the plurality of circuit contacts 40 of the stacked package 4. Normally a solder material is provided in advance on the stacked package 4 or the conductor elements 3 of the circuit pin positioning structure 1.

In step S704, the stacked package 4 and the circuit pin positioning structure 1 are both placed in heating equipment 6, which heats to a predetermined temperature at which the solder material melts, so as to melt the solder material provided on the stacked package 4 or the conductor elements 3 of the circuit pin positioning structure 1, and thereby solder the circuit pin positioning structure 1 to the stacked package 4.

In step S705, when the soldering process is finished, the stacked package 4 and the circuit pin positioning structure 1 are removed from the heating equipment 6. The solder material between the stacked package 4 and the circuit pin positioning structure 1 is allowed to cool down for a period of time to cure.

In step S706, the pick and place equipment 5 is used to remove and detach the positioning rack 2 of the circuit pin positioning structure 1 from the conductor elements 3 soldered to the stacked package 4. The removed positioning rack 2 may be discarded through the pick and place equipment 5. Further in this step, the conductor elements 3 can be checked to see if there is any of them being defectively soldered to the stacked package 4. It should be noted, the heating equipment 6 may heat the positioning rack 2 in order to release the interference internal stress in the positioning rack 2 generated in response to pressure from the conductor elements 3, such that the positioning rack 2 can be easily detached from the conductor elements 3.

In step S707, the production line provides another stacked package 4 and stacks it on a side of the conductor elements 3 free of being soldered to the above stacked package 4. Then, the above steps S701 to S706 are repeated until a package structure having a plurality of stacked packages 4 being stacked is completed. This fabrication method allows a predetermined package structure to be formed in a time-effective, cost-effective, easy-operation and precise-alignment way.

Figure 21:
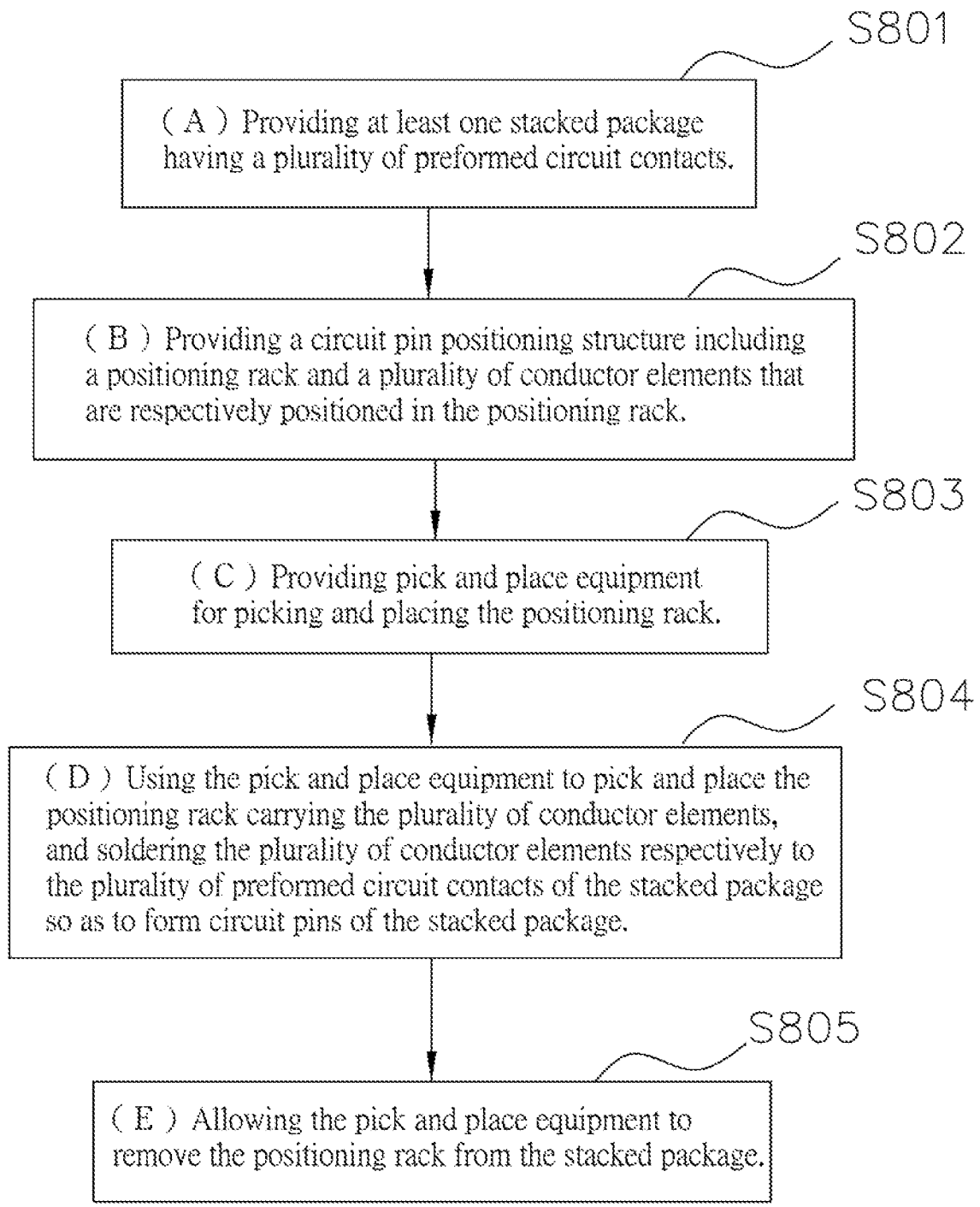
FIG. 21 is a flowchart of a method of forming circuit pins of a stacked package of the invention.

As shown in FIG. 21, a method of forming circuit pins of a stacked package according to the invention is provided, which includes the following steps.

In step S801, a production line provides a stacked package 4 having a plurality of circuit contacts 40.

In step S802, a circuit pin positioning structure 1 is provided, which includes a positioning rack 2 and a plurality of conductor elements 3 respectively positioned in the positioning rack 2.

In step S803, pick and place equipment 5 is provided, for picking and placing the positioning rack 2.

In step S804, the pick and place equipment 5 is operated to pick and place the positioning rack 2 that carries the plurality of conductor elements 3, and allow the plurality of conductor elements 3 to be respectively soldered to the plurality of circuit contacts 40 of the stacked package 4, so as to form circuit pins of the stacked package 4.

In step S805, the pick and place equipment 5 is operated to remove the positioning rack 2 of the circuit pin positioning structure 1 from the plurality of conductor elements 3 soldered to the stacked package 4.

Figure 14:
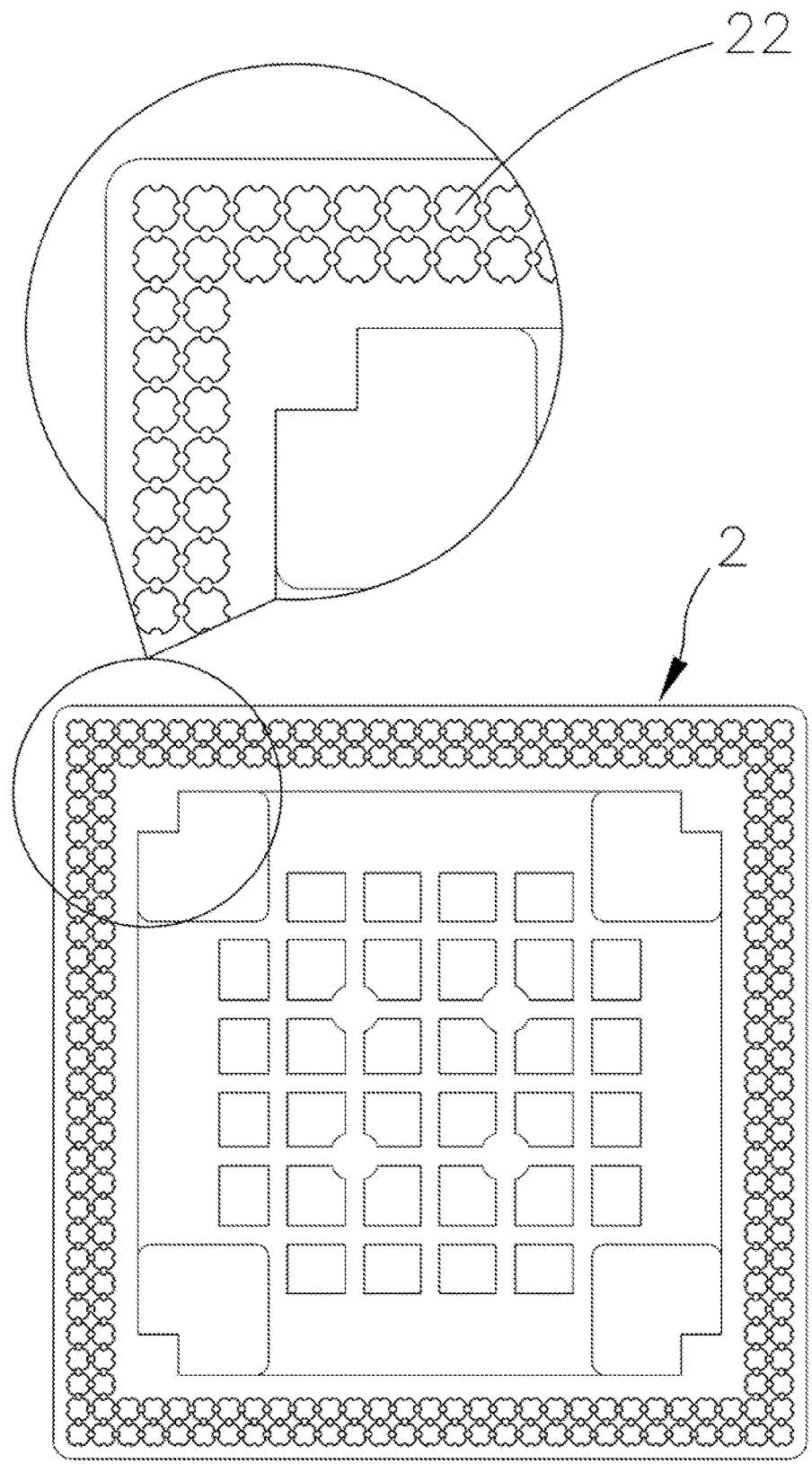
FIG. 14 is a bottom view of a third embodiment of the invention.

As shown in FIG. 14, the positioning holes 22 of the positioning rack 2 have an irregular shape. It however should be understood that, the positioning holes 22 of the positioning rack 2 in the invention may be rectangular, circular, polygonal or have other shapes.

Figure 15:
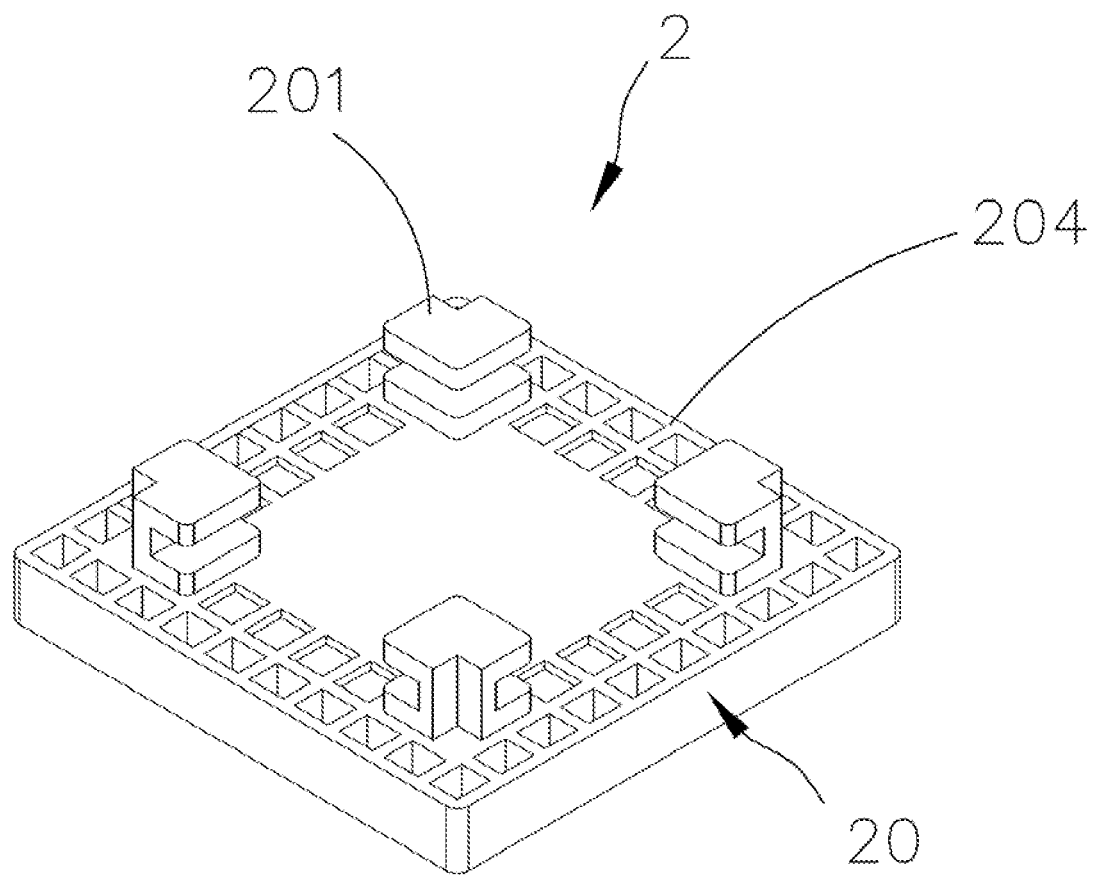
FIG. 15 is a perspective view of a fourth embodiment of the invention.
Figure 20:
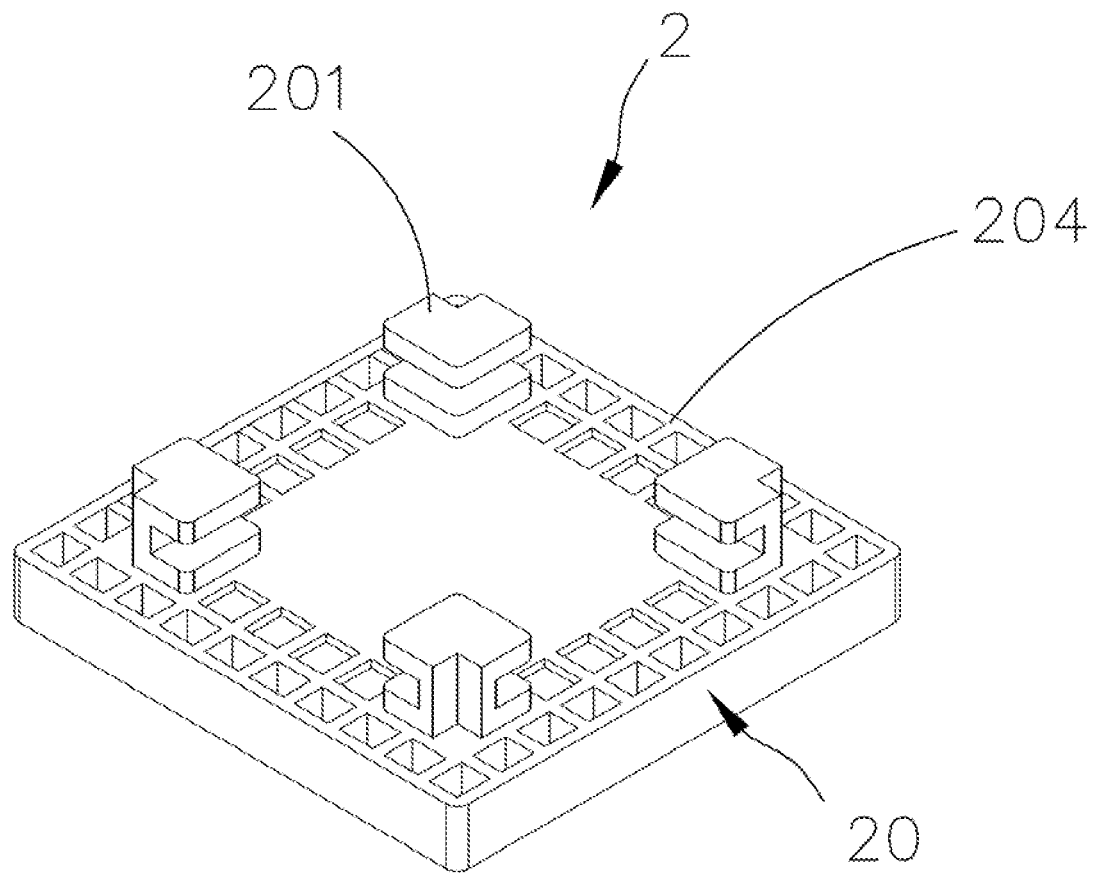
FIG. 20 is a sectional view of a ninth of the invention.

As shown in FIGS. 15 and 20, the operational portion 20 of the positioning rack 2 includes at least one operational protrusion 201 extended outwardly from the top surface 204, for allowing the pick and place equipment (not shown) to clamp or hook the operational protrusion 201.

Figure 16:
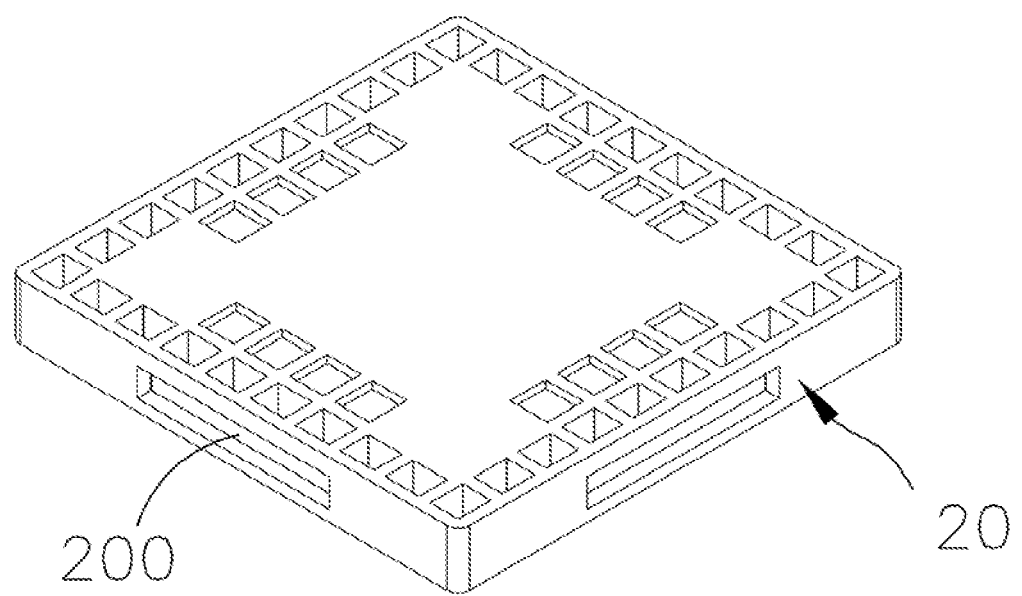
FIG. 16 is a perspective view of a fifth embodiment of the invention.

As shown in FIG. 16, the operational portion 20 is formed on a side of the positioning rack 2 and includes at least one operational slot 200, for allowing the pick and place equipment to clamp and pick the operational slot 200.

Figure 17:
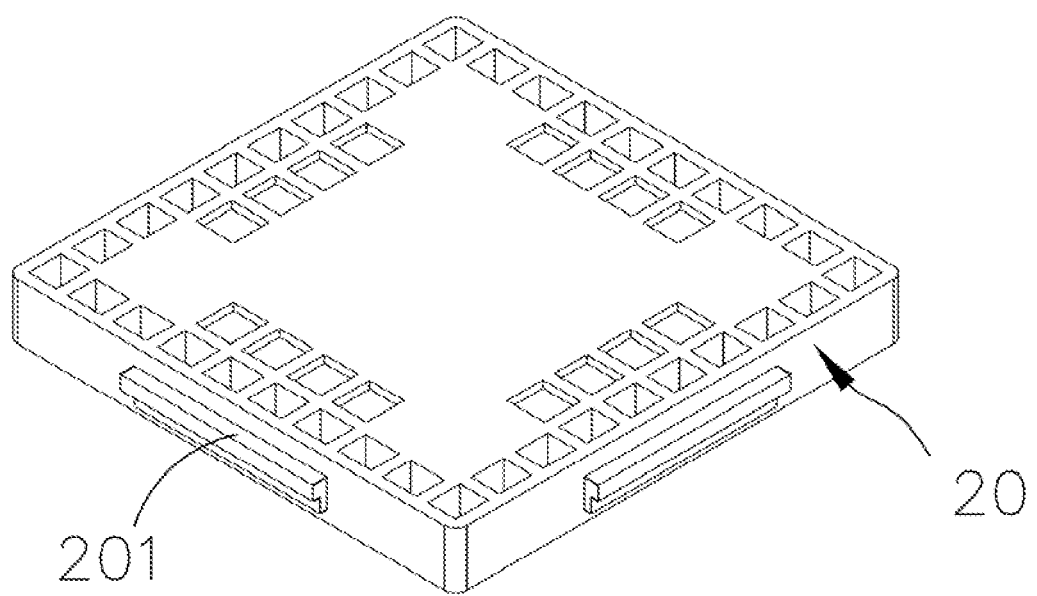
FIG. 17 is a perspective view of a sixth embodiment of the invention.

As shown in FIG. 17, the operational portion 20 is formed on a side of the positioning rack 2 and includes at least one operational protrusion 201, for allowing the pick and place equipment to clamp and pick the operational protrusion 201.

Figure 18:
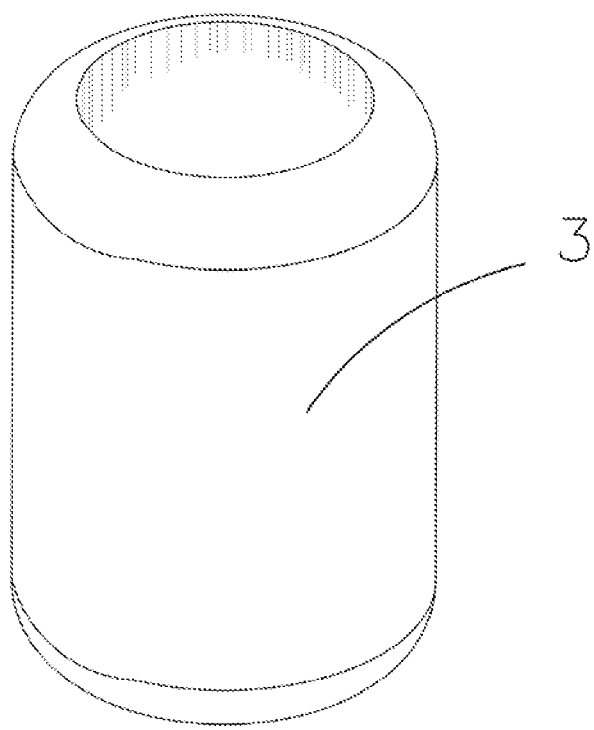
FIG. 18 is a perspective view of a conductor element of a seventh embodiment of the invention.

As shown in FIG. 18, the conductor element 3 is a circular tube. It should be understood that in the invention, the conductor element 3 may also be a cylinder, a polygonal pillar, a polygonal tube, or a pillar or tube of any other shape.

Figure 19:
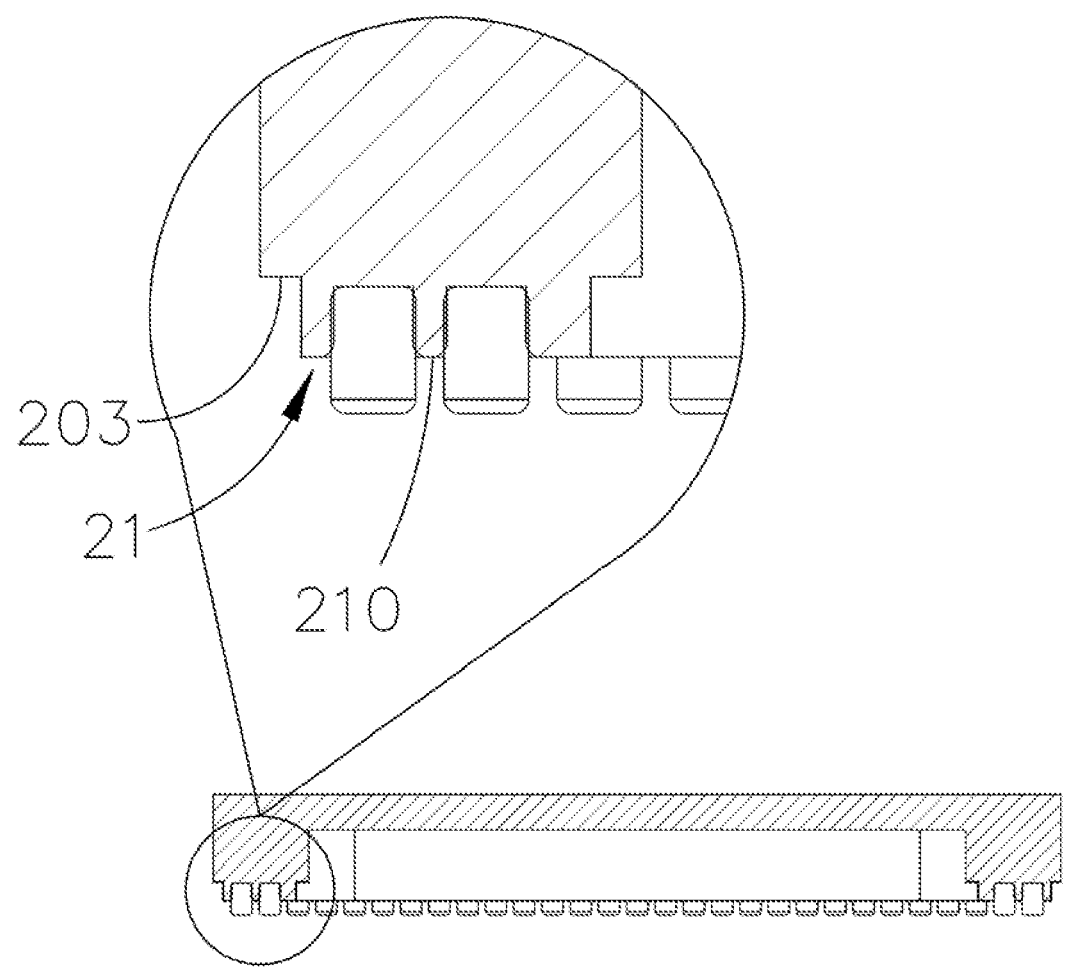
FIG. 19 is a sectional view of an eighth of the invention.

As shown in FIG. 19, the conductor positioning area 21 is extended outwardly from the bottom surface 203 to form the contact region 210.

The examples above are only illustrative to explain principles and effects of the invention, but not to limit the invention. It will be apparent to those skilled in the art that modifications and variations can be made without departing from the spirit and scope of the invention. Therefore, the protection range of the rights of the invention should be as defined by the appended claims.

What is claimed is:

1. A method of forming circuit pins of a stacked package, including the steps of:
   (A1) providing at least one stacked package having a plurality of preformed circuit contacts;
   (B1) providing a circuit pin positioning structure including a positioning rack and a plurality of conductor elements, wherein the plurality of conductor elements are formed by cutting a material and respectively positioned in the positioning rack;
   (C1) providing pick and place equipment for picking and placing the positioning rack;
   (D1) using the pick and place equipment to pick and place the positioning rack carrying the plurality of conductor elements, and soldering the plurality of conductor elements respectively to the plurality of preformed circuit contacts of the stacked package so as to form circuit pins of the stacked package; and
   (E1) allowing the pick and place equipment to remove the positioning rack from the stacked package.

2. The method of forming circuit pins of a stacked package according to claim 1, wherein the plurality of conductor elements are respectively embedded and positioned in a plurality of positioning holes formed in the positioning rack.

3. The method of forming circuit pins of a stacked package according to claim 2, wherein the positioning rack is made of a plastic material.

4. A fabrication method of soldered circuit elements for a semiconductor package structure, the fabrication method including the steps of:
   (A) providing at least one stacked package having a plurality of preformed circuit contacts;
   (B) providing pick and place equipment and a circuit pin positioning structure for being mounted with the pick and place equipment, the circuit pin positioning structure including a positioning rack and a plurality of conductor elements, wherein the positioning rack is formed with a plurality of positioning holes, and the plurality of conductor elements are respectively positioned in the plurality of positioning holes of the positioning rack;
   (C) using the pick and place equipment to place the circuit pin positioning structure on the stacked package in a manner that the plurality of conductor elements of the circuit pin positioning structure are respectively in contact with the plurality of preformed circuit contacts of the stacked package;
   (D) providing heating equipment and placing the stacked package and the circuit pin positioning structure in the heating equipment, and having the heating equipment heat to a solder-material melting temperature so as to solder the circuit pin positioning structure to the stacked package;
   (E) removing the soldered circuit pin positioning structure and stacked package from the heating equipment; and
   (F) using the pick and place equipment to remove the positioning rack of the circuit pin positioning structure from the stacked package.

5. The fabrication method of soldered circuit elements according to claim 4, further including: repeating the above steps (A) to (F) until a package structure having a plurality of stacked packages is formed.

6. The fabrication method of soldered circuit elements according to claim 4, wherein the plurality of conductor elements to be respectively positioned in the plurality of positioning holes abuts against and presses on the positioning rack in a manner of causing material deformation of the positioning rack.

7. The fabrication method of soldered circuit elements according to claim 6, wherein the positioning rack is heated by the heating equipment to release internal stress generated between the positioning rack and the plurality of conductor elements.

\* \* \* \* \*